(12) United States Patent
Heijden et al.

(10) Patent No.: US 7,098,746 B2
(45) Date of Patent: Aug. 29, 2006

(54) VOLTAGE CONTROLLED OSCILLATOR

(75) Inventors: Edwin Heijden, Eindhoven (NL); Hugo Veenstra, Eindhoven (NL)

(73) Assignee: Koninklijke Phillps Electronics N.V., Eindhoven (NL)

( * ) Notice: Subject to any disclaimer, the term of this patent is extended or adjusted under 35 U.S.C. 154(b) by 0 days.

(21) Appl. No.: 10/523,891

(22) PCT Filed: Jul. 21, 2003

(86) PCT No.: PCT/IB03/03297

§ 371 (c)(1),
(2), (4) Date: Feb. 4, 2005

(87) PCT Pub. No.: WO2004/015852

PCT Pub. Date: Feb. 19, 2004

(65) Prior Publication Data

US 2005/0258912 A1    Nov. 24, 2005

(30) Foreign Application Priority Data

Aug. 8, 2002 (EP) .................................. 02078287

(51) Int. Cl.
*H03B 29/00* (2006.01)
(52) U.S. Cl. ............... 331/78; 331/117 R; 331/117 FE; 331/167
(58) Field of Classification Search .................. 331/78, 331/117 R, 117 FE, 167
See application file for complete search history.

(56) References Cited

U.S. PATENT DOCUMENTS 4,608,544 A * 8/1986 Nordholt et al. ............ 331/109

* cited by examiner

*Primary Examiner*—Arnold Kinkead
(74) *Attorney, Agent, or Firm*—Adam L. Stroud

(57) ABSTRACT

A voltage-controlled oscillator comprising a LC tank circuit coupled to a pair of transistors and crossed-coupled to a pair of emitter follower transistors each transistor having a collector, an emitter and a base, the voltage controlled oscillator being characterized in that a supply voltage applied to the collectors of the emitter follower transistors is substantially different from a supply voltage applied to the bases of the emitter follower transistors.

3 Claims, 2 Drawing Sheets

VOLTAGE CONTROLLED OSCILLATOR

The invention relates to a voltage-controlled oscillator comprising a LC tank circuit coupled to a pair of transistors and crossed-coupled to a pair of emitter follower transistors, each transistor having a collector, an emitter and a base.

The invention also relates to a pseudo random generator comprising such a voltage-controlled oscillator.

Voltage controlled oscillators (VCOs) are extensively used in communication systems as receivers, transmitters, and transceivers. They also could be used as clock generators for digital systems. A classical prior-art differential LC VCO is shown in FIG. 4. It comprises a pair of transistors Tp1, Tp2 having their emitters coupled to a current source Ie for biasing. A LC tank circuit comprises inductors Lp1 and Lp2 coupled to a pair of voltage controlled capacitors implemented with variable capacitance diodes D1 and D2. A voltage VT controls the capacitance of the diodes D1 and D2. The pair of transistors Tp1, Tp2 is cross-coupled i.e. a collector of one of the transistors is connected to a base of the other transistor and reciprocally. A major disadvantage of the topology shown in FIG. 4 is that the two transistors operate in saturation due to the relatively same DC bias at base and collector. The base-collector diodes are forward-biased by the voltage swing, limiting the maximum attainable swing.

U.S. Pat. No. 5,847,621 discloses an LC oscillator with delay tuning comprising a pair of transistors coupled to an LC tank circuit. A cross-coupling feedback is realized with a pair of emitter followers. The emitter followers and the pair of transistors are biased via current generators controlled by a bias voltage. Using voltage followers the oscillator is better buffered when it is coupled to a load impedance. It is observed that the bias voltage for the emitter followers base and collector are substantially the same and the transistors also work at saturation. Hence, as it was previously shown, a maximum voltage swing cannot be obtained. Furthermore, the swing limitation determines a higher phase noise.

U.S. Pat. No. 6,150,893 discloses a voltage-controlled oscillator comprising two sub-circuits, each sub-circuit comprising a pair of transistors. The first sub-circuit is an LC oscillation sub-circuit in which each transistor has a capacitive transformer in it's feedback loop. It is observed that the transistors in the two sub-circuits have different bias voltages at their bases and at their collectors but the additional capacitors require an additional chip area.

It is therefore an object of the present invention to obtain a voltage-controlled oscillator having an improved output voltage swing and a lower phase noise.

In accordance with the invention this is achieved in a voltage-controlled oscillator as described in the introductory paragraph, the voltage-controlled oscillator being characterized in that a supply voltage applied to the collectors of the emitter follower transistors is substantially different from a supply voltage applied to the bases of the emitter follower transistors. When NPN bipolar transistors are considered, the bias voltage of the collectors is higher than the bias voltage of the bases of the transistors. The complementary situation occurs when PNP bipolar transistors are considered. The transistors could be implemented in different technologies as Si, Si—Ge and so on. Because the transistors do not operate in saturation mode the output voltage swing is increased.

In an embodiment of the invention the LC tank circuit is coupled to the supply voltage via a bipolar transistor connected as a diode for generating substantially different supply voltages for the bases and collectors of the emitter follower transistors. Different biases for the bases and collectors of the transistors could be obtain using e.g. resistors and decupling capacitors. But the area occupied by the circuit increases especially due to the capacitors. Hence, using a bipolar transistor connected as diode results in a more efficient use of the semiconductor area where the oscillator is implemented.

Another aspect of the invention provides a pseudo random sequence generator comprising a first sequence generator and a second sequence generator driven by the voltage controlled oscillator. A first output of the first sequence generator and a second output of the second sequence generator are coupled to a multiplexer. The multiplexer is driven by an output signal of the voltage controlled oscillator for selecting either a signal outputted by the first sequence generator or a signal outputted by the second sequence generator. The multiplexer generates at a third output a binary signal having a bit-rate that is substantially double a bit-rate obtained either at the first output or at the second output. Pseudo random sequence generators are extensively used in testing digital integrated circuits to generate test vectors. It is preferably that the test of a circuit to last as short time as possible. The test speed is determined inter alia by a period of the voltage-controlled oscillator output signal that is used as clock. An ordinary sequence generator generates a new test vector whenever occurs a transition from e.g. a low level to a high level in the amplitude of the clock signal. Otherwise said, the speed of generation of test vectors has the same frequency as the frequency of the clock. A substantially double speed for generating the test vectors is obtained using two interleaved sequence generators coupled to a multiplexer. The first sequence generator generates an output signal at a transition from a low level to a high level in the amplitude of the clock signal, the second sequence generator generating an output signal at a high level to a low level in the amplitude of the clock signal.

In an embodiment of the invention each of the sequence generators, comprises a closed-chain of flip-flops each having a data input, a clock input, a preset input and an output. The pseudo random sequence generator further comprises a feedback including a XOR gate having an output coupled to a first of the flip-flops data input and a pair of inputs coupled to a pair of outputs of the flip-flops. The feedback is used for allowing the register to work properly in a ring mode. The output of the pseudo random generator is obtained at the outputs of the flip-flops as a vector of binary signals.

The above and other features and advantages of the invention will be apparent from the following description of exemplary embodiments of the invention with reference to the accompanying drawings, in which.

Figure 1:
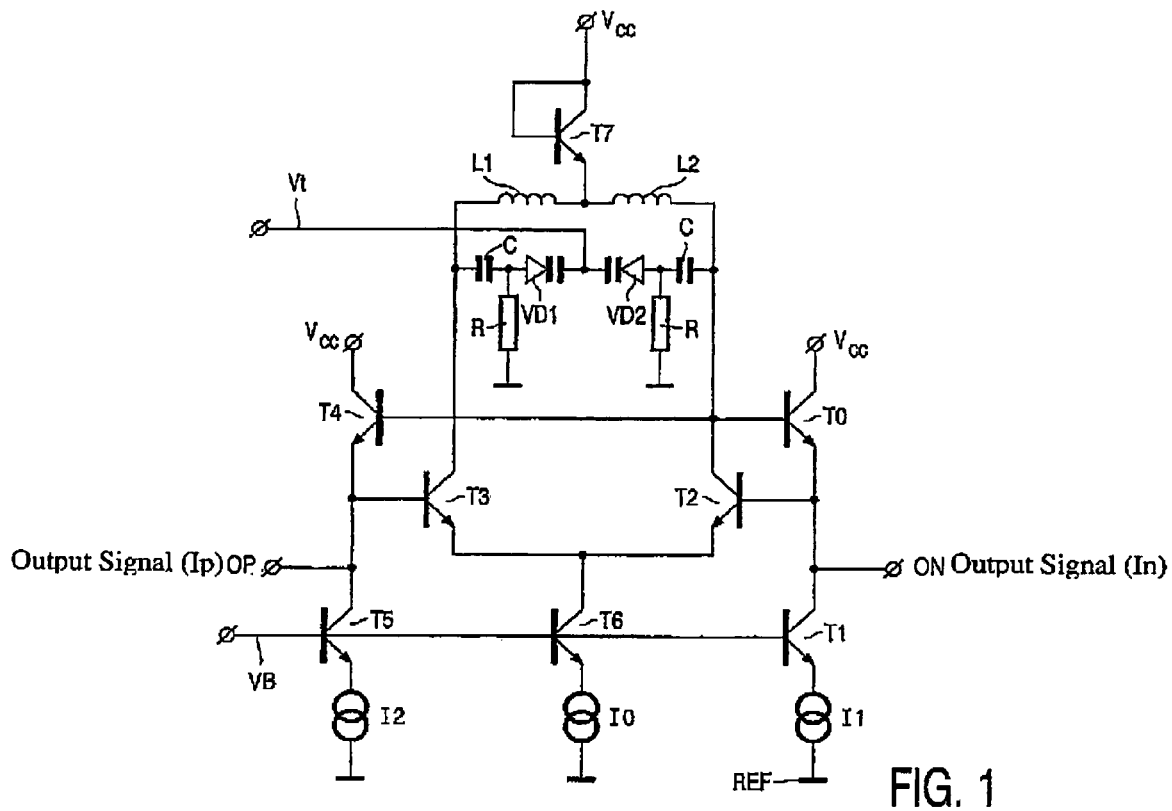
FIG. 1 depicts a voltage-controlled oscillator according to the invention.
Figure 4:
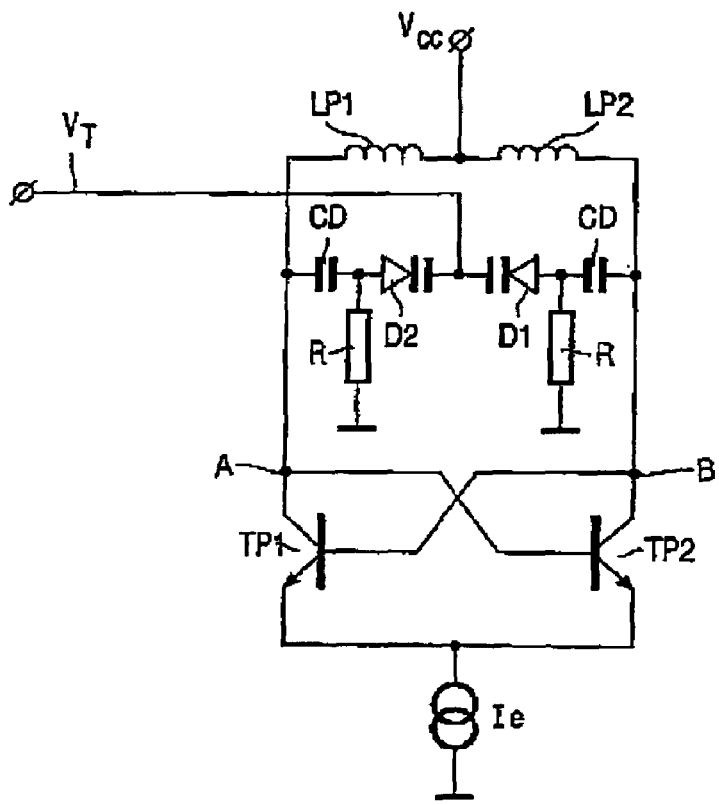
FIG. 4 depicts a prior-art voltage controlled oscillator.

FIG. 1 depicts a voltage-controlled oscillator according to the invention. The voltage-controlled oscillator comprises a LC tank circuit L1, L2, VD1, VD2 coupled to a pair of transistors T2, T3 and crossed-coupled to a pair of emitter follower transistors T0, T4. Each of the transistors has a collector, an emitter and a base. A supply voltage applied to the collectors of the emitter follower transistors T0, T4 is substantially different than a supply voltage applied to the bases of the emitter follower transistors T0, T4. The inductance of the inductors L1, L2 and the capacitance of the capacitors VD1, VD2, determine an oscillation frequency of the voltage-controlled oscillator. The capacitors VD1 and VD2 are varicap diodes. Hence, they are controllable by a tuning voltage Vt. Capacitors C having a capacitance substantially larger that the maximum capacity of the varicap diodes are used as decupling capacitors having a relatively small influence on the oscillation frequency of the voltage-controlled oscillator. Resistors R are used for biasing the varicap diodes. The collectors of the transistors T2 and T3 are cross-coupled to the bases of the transistors T4 and T0, respectively. The transistors T4 and T0 are connected as emitter followers being biased via current generators T1 and T5, the current generators being controlled by a bias voltage $V_B$. It is observed that the collectors of the transistors T0 and T4 are connected to the supply voltage Vcc and their bases are connected to a substantially lower voltage that could be approximated as Vcc-$V_{BE}$, where $V_{BE}$ is a base to emitter voltage of a bipolar transistor T7. It should be pointed out here that a resistance of the inductors L1, L2 is negligible because the inductance should have a quality factor as higher as possible reducing the losses in the tank circuit. When Vcc was 3V the output oscillation voltage was 1.2 V while the output swing of the prior-art voltage-controlled oscillator shown in FIG. 4 is approximately 0.5V. The corresponded phase noise of the voltage-controlled oscillator shown in FIG. 1 is circa −108 dBc/Hz while the phase margin of the prior-art oscillator is −95 dBc/Hz. It is further observed that the emitter follower transistors buffer the voltage-controlled oscillator for minimizing the influences of a load on the amplitude and frequency of the signal generated by the oscillator. The circuit shown in FIG. 1 was implemented using NPN bipolar transistors but a skilled person in the art could relatively easy implement the circuit using PNP bipolar transistors. Furthermore, the transistors could be implemented in different technologies as Si, Si—Ge and so on. Because the transistors do not operate in saturation mode the output voltage swing is increased. It is also observed that different biases for the bases and collectors of the transistors could be obtain using e.g. resistors and relatively high capacitance decoupling capacitors. But the area occupied by the circuit increases especially due to the capacitors. Hence, using a bipolar transistor connected as diode results in a more efficient use of the semiconductor area where the oscillator is implemented.

Figure 2:
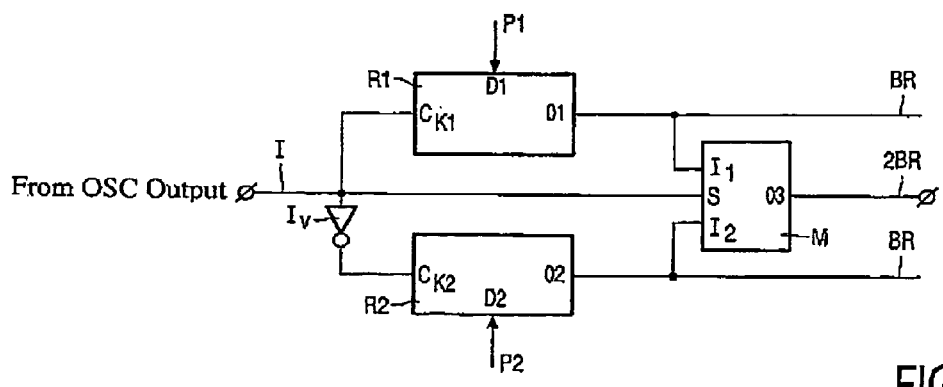
FIG. 2 depicts a pseudo random sequence generator according to an embodiment of the invention.

FIG. 2 depicts a pseudo random sequence generator (PRSG). The PRSG comprises a first sequence generator R1 and a second sequence generator R2 driven by a voltage controlled oscillator as shown in FIG. 1. A first output O1 of the first sequence generator R1 and a second output O2 of the second sequence generator R2 are coupled to a multiplexer M driven by an output signal I of the voltage controlled oscillator. The signal I selects either a signal outputted by the first sequence generator R1 or a signal outputted by the second sequence generator R2. The multiplexer M generates at a third output O3 a binary signal having a bit-rate substantially double the bit rate obtainable with only one of the sequence generators R1, R2. A sequence is defined hereinafter as a succession of binary data (bits). The first sequence generator generates an output bit at the first output O1 only at a transition from a low value to a high value of the signal I. Hence, in every period of the signal I a bit is generated at the first output O1. Similarly, a bit is generated at the second output O2 at every transition from a high level to a low level of the signal I. The multiplexer M transfer the signal from it's input I1 to it's output O3 when the signal I has a high level and the signal from it's input I2 to the output O3 when the signal I has a low level. Following a transition from a low value to a high value of the signal I the bit presented at the first input I1 is transferred to the output O3. After a transition from a high level to a low level of signal I the signal from the input I2 is transferred to the output O3. Hence, every half period of the signal I a bit is generated at the output O3. If we note as BR the bit rate either at the output O1 or at the output O2 then the bit rate at the output O3 noted as 2BR is substantially 2*BR. This feature is very attractive because the bit rate at the output O3 is obtained using a relatively low frequency clock signal I.

Figure 3:
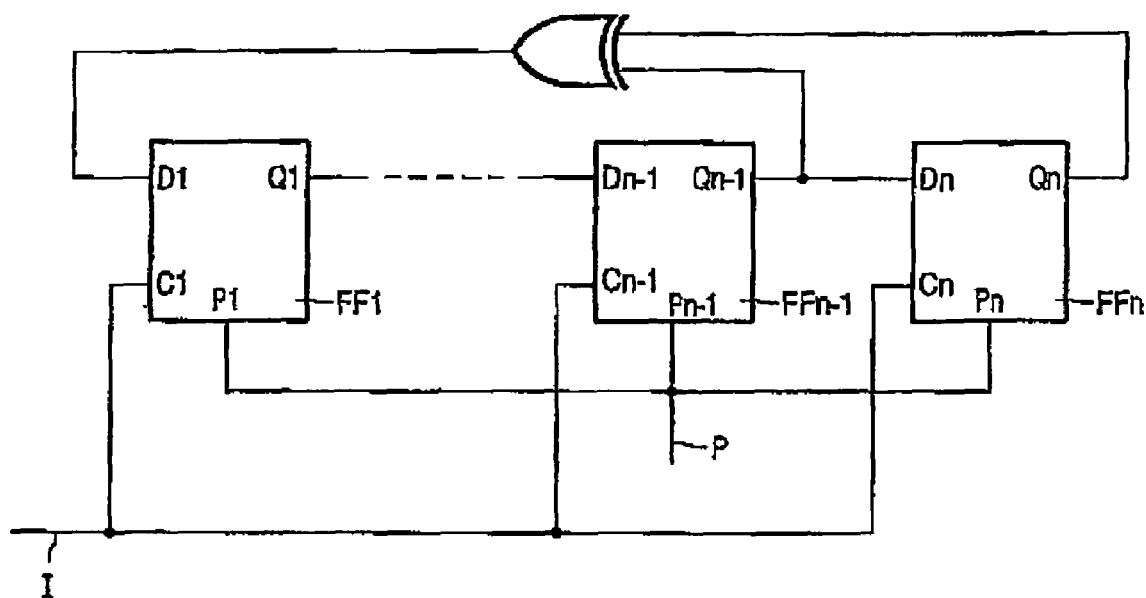
FIG. 3 depicts a chain of flip-flops used in the random generator according to an embodiment of the invention.

FIG. 3 depicts a chain of flip-flops $FF_1, \ldots, FF_n$, used in the pseudo random generator according to an embodiment of the invention. The chain of flip-flops represents a presetable shift register connected in a ring for generating a pseudo-random vector of digital signals. The output signal I of the voltage-controlled oscillator shown in FIG. 1 drives the pseudo random sequence generator. The pseudo random generator comprises a chain of N flip-flops each having a data input $D_1, \ldots, D_{n-1}, D_n$, a clock input $C_1, \ldots, C_{n-1}, C_n$, a preset input $P_1, \ldots, P_{n-1}, P_n$ and an output $Q_1, \ldots, Q_{n-1}, Q_n$. For simplicity we consider that the flip-flop $FF_1$ is the first one in the chain and the flip-flop $FF_1$ is the last one in the chain. The pseudo random sequence generator further comprises a feedback including a XOR gate having an output coupled to the first of the flip-flops $FF_1$ data input $D_1$ and a pair of inputs coupled to a pair of outputs $Q_n$, $Q_{n-1}$ of the last and one-before-last flip-flops. The flip-flops are first preset in a binary state using binary signals inputted via preset inputs $P_1, \ldots, P_{n-1}, P_n$. Hence, the binary values $P_i$ is present at the output $Q_i$. Every positive edge of the signal I determines a transfer of the binary value from an output $Q_i$ to the output $Q_{i+1}$. In order to close the chain, a feedback comprising a XOR gate between the outputs $Q_{n-1}$ and $Q_n$ is provided.

It is observed that the signal I could be single ended i.e. either In or Ip in FIG. 1 or differential. Accordingly the flip-flops could be single ended or differential.

It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A voltage-controlled oscillator comprising a LC tank circuit coupled to a pair of transistors and crossed-coupled to a pair of emitter follower transistors, each transistor having a collector, an emitter and a base, the voltage controlled oscillator being characterized in that a supply voltage applied to the collectors of the emitter follower transistors is substantially different from a simply voltage applied to the bases of the emitter follower transistors, and wherein the LC tank circuit is coupled to the supply voltage via a bipolar transistor connected as a diode for obtaining a substantially different supply voltages for the bases and collectors of the emitter follower transistors.

2. A pseudo random sequence generator comprising a first sequence generator and a second sequence generator driven by a voltage controlled oscillator as claimed in claim 1, a first output of the first sequence generator and a second output of the second sequence generator being coupled to a multiplexer driven by an output signal of the voltage controlled oscillator for selecting either a signal outputted by the first sequence generator or a signal outputted by the second sequence generator, the multiplexer generating at a third output a binary signal having a bit-rate that is substantially double a bit-rate obtained either at the first output or at the second output.

3. A pseudo random sequence generator as claimed in claim 2, wherein each of the sequence generators comprises a closed-chain of flip-flops each having a data input, a clock input, a preset input and an output, the pseudo random sequence generator further comprising a feedback including a XOR gate having an output coupled to a first of the flip-flops data input and a pair of inputs coupled to a pair of outputs of the flip-flops.

* * * * *